(12) United States Patent
Nishida et al.

(10) Patent No.: US 6,954,025 B2
(45) Date of Patent: Oct. 11, 2005

(54) RESONANT ENERGY MEMS ARRAY AND SYSTEM INCLUDING DYNAMICALLY MODIFIABLE POWER PROCESSOR

(75) Inventors: Toshikazu Nishida, Gainesville, FL (US); Louis N. Cattafesta, III, Gainesville, FL (US); Mark Sheplak, Gainesville, FL (US); Khai D. T. Ngo, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 156 days.

(21) Appl. No.: 10/436,534

(22) Filed: May 13, 2003

(65) Prior Publication Data

US 2004/0007942 A1 Jan. 15, 2004

Related U.S. Application Data

(60) Provisional application No. 60/380,187, filed on May 13, 2002.

(51) Int. Cl.[7] .......................... H02N 2/00; H01L 41/107
(52) U.S. Cl. ...................................... 310/339; 310/319
(58) Field of Search ........................ 310/319, 329–330, 310/339

(56) References Cited

U.S. PATENT DOCUMENTS

| | | | | |
|---|---|---|---|---|
| 3,609,593 | A | * | 9/1971 | Boll et al. ............... 331/156 |
| 5,801,475 | A | | 9/1998 | Kimura ..................... 310/319 |
| 6,340,787 | B1 | | 1/2002 | Simeray et al. ............ 136/201 |
| 6,479,920 | B1 | * | 11/2002 | Lal et al. .................. 310/309 |
| 6,522,048 | B1 | | 2/2003 | Burns et al. ............ 310/316.01 |
| 6,595,058 | B2 | * | 7/2003 | Lai et al. .................... 73/584 |
| 6,768,944 | B2 | * | 7/2004 | Breed et al. ............... 701/301 |
| 6,771,007 | B2 | * | 8/2004 | Tanielian ................... 310/339 |
| 6,771,454 | B2 | * | 8/2004 | White et al. ............. 360/77.03 |
| 2002/0060507 | A1 | | 5/2002 | Cuhat et al. ............... 310/319 |
| 2002/0145350 | A1 | | 10/2002 | Henderson ................. 310/339 |
| 2003/0041767 | A1 | * | 3/2003 | Rastegar et al. ........... 102/207 |
| 2003/0080082 | A1 | * | 5/2003 | Chinn et al. ................ 216/2 |
| 2003/0137220 | A1 | | 7/2003 | Pinkerton ................... 310/339 |
| 2003/0234835 | A1 | * | 12/2003 | Torii et al. .................. 347/68 |
| 2004/0214435 | A1 | * | 10/2004 | Yuasa ........................ 438/689 |
| 2005/0074871 | A1 | * | 4/2005 | Albert et al. ............ 435/287.2 |

OTHER PUBLICATIONS

Alumni Association, "Power Walking," MIT Technology Review, p. 17, Oct. 2001.

Kymissis et al., "Parasitic Power Harvesting in Shoes." Second IEEE International Conference on Wearable Computing (ISWC), Oct. 1998.

Pelrine et al., "Dielectric Elastomers: Generator Mode Fundamentals and Applications," Proc. SPIE, 4329:148–156, 2001.

* cited by examiner

Primary Examiner—Darren Schuberg
Assistant Examiner—J. Aguirrechea
(74) Attorney, Agent, or Firm—Akerman Senterfitt

(57) ABSTRACT

An integrated MEMS resonant generator system includes a substrate, a plurality of piezoelectric micro generators disposed on the substrate, the micro generators each generating a voltage output in response to vibrational energy received, and at least one power processor disposed on the substrate. The power processor electrically coupled to outputs of the plurality of micro generators. When the input conditions change, the power processor can dynamically adjust its switching functions to optimize the power delivered to a load or energy storage reservoir.

19 Claims, 10 Drawing Sheets

INTERNAL FORCE TRANSFORMED INTO
EQUIVALENT VOLTAGE SOURCE $$V_{Th} = \frac{\left(\dfrac{1}{j\omega C_0'} + R_e\right)\dfrac{F}{\phi}}{\dfrac{1}{j\omega C_0'} + R_e + \dfrac{j\omega M_{eff}}{\phi^2} + \dfrac{1}{j\omega \phi^2 C_{eff}} + \dfrac{R_{eff}}{\phi^2}}$$

US 6,954,025 B2

RESONANT ENERGY MEMS ARRAY AND SYSTEM INCLUDING DYNAMICALLY MODIFIABLE POWER PROCESSOR

CROSS-REFERENCE TO RELATED APPLICATIONS

This application claims priority to the U.S. provisional application No. 60/380,187 filed May 13, 2002, which is incorporated herein by reference in its entirety.

STATEMENT REGARDING FEDERALLY SPONSORED RESEARCH OR DEVELOPMENT

The United States Government has rights in this invention pursuant to Grant No. N00014 99 1 0450 between the Office of Naval Research and the University of Florida.

FIELD OF THE INVENTION

The invention relates to power generators, more particularly, to self powered microsystem generators.

BACKGROUND

Over the years there has been a growing interest in the field of miniature sensors. Applications for miniature sensors are wide ranging and include medical implants and embedded sensors in buildings. One specific area that has received little attention is how to supply the required electrical power to such sensors. Conventional power supplies, such as batteries, can be disposed external to such sensors. However, certain applications require the sensors to be completely embedded in the structure with no physical connection to a location outside the structure. Supplying power to such systems is generally difficult. As a result, these sensors typically need their own self-powered power supply.

Batteries are not generally a viable solution for devices such as embedded sensors. Batteries contain a finite amount of energy and have a limited lifetime. Batteries also can contain hazardous chemicals, can be quite bulky and can fail without notice.

Self powered microsystems can convert energy from an existing ambient energy source into a different form of energy, such as electrical energy. Electrical generators based on self powered microsystems can be used to generate low noise electrical power, virtually eliminate cross talk between power lines and signal lines, and can operate efficiently with a relatively simple power delivery and control system.

Some possible ambient energy sources which can be converted into electrical energy include light energy, thermal energy, volume flow energy and mechanical energy. However, mechanical vibrations may be the only feasible ambient source of energy when the former energy sources are typically unavailable, such as in embedded applications where there is no light, no flow, and zero temperature gradient.

The transformation of mechanical vibrations into electrical power is generally accomplished using the piezoelectric effect. The piezoelectric effect results in a voltage being generated across dielectric crystals which are subjected to mechanical stress. For example, micro-mechanical generators (micromachined silicon/piezoelectric device) may be constructed by depositing thin-films of lead zirconate titanate (PZT) onto single crystal silicon. Single crystal silicon possesses excellent mechanical properties for this type of application.

Although self powered microsystems can generate their "own" energy, they generally require an energy storage device as the output generated may vary rapidly with time. The ambient energy may also not be present at all times or some start-up power may be required. Ideally the chosen energy storage device exhibits high power and energy densities with the smallest size possible. Batteries (e.g. Li batteries) and capacitors, including supercapacitors may be used as energy storage devices in conjunction with self powered microsystems.

Vibrational energy harvesting approaches may be categorized in terms of physical size and the transduction approach. Meso-scale energy harvesting approaches have included rotary generators embedded in a boot, a moving coil generator, piezoelectric patches placed in the heel and midsole of a shoe, and a dielectric elastomer with compliant electrodes. For the meso-scale harvesters, the reported power output ranges from 400 $\mu$W to over 500 mW for single generator units, but this figure does not take into account variation in sizes and force inputs.

To match a generator and the load impedances for optimal power transfer, a power converter is generally inserted between the generator and the load. Due to their simplicity, pulsewidth-modulated (PWM) converters have been the preferred choice for the matching function. In order to keep the waveforms piecewise linear, however, the inductances in these converters need to be scaled inversely with power level and switching frequency.

Since the power level is typically only in the sub-milliwatt range for vibrational energy harvesting and the switching frequency is generally kept in the sub-kilohertz range, inductances in the 1–10 millihenry range have been reported. The corresponding volume is on the order of a few cubic inches. Such a volume is clearly not compatible with die-based MEMS fabrication processing which requires inductances in the power converters be in the sub-microhenry range to achieve a reasonable die size. Moreover, the power conversion efficiency of disclosed vibrational energy harvesting systems has been low primarily because the switching frequency used has not been optimized to keep the power losses in the power converter substantially less than the amount of power being extracted.

SUMMARY OF THE INVENTION

An integrated MEMS resonant generator system includes a substrate, a plurality of piezoelectric micro generators disposed on the substrate, the micro generators each generating a voltage output in response to vibrational energy received. At least one power processor is disposed on the substrate, the power processor electrically coupled to outputs of the plurality of micro generators. When the input conditions change, the power processor can dynamically adjust its switching functions, such as the on time, off time, period, or phase to maximize the power delivered to a load or energy storage reservoir. The plurality of micro generators can collectively provide more than one resonant frequency. The substrate is preferably a single crystal silicon die.

The power processor preferably includes structure for providing a dynamically adjustable switching function. In one embodiment, the power processor includes a rectifier for providing a rectified output voltage from the voltage output by the micro generators and a controller which includes a peak detector, where dynamic switching of the power processor is based on the peak detector determining instants when the rectified voltage is at a peak value. In another embodiment, the power processor includes a controller which dynamically adjusts an input impedance of the power processor, the input impedance dynamically matching, such as being the complex conjugate, of the output impedances of the plurality of micro generators. In yet another embodiment, the power processor includes a controller which dynamically maximizes charge transferred into a load or an energy reservoir.

The plurality of micro generators are interconnected to form sub-arrays comprising groups of micro generators. In this embodiment, the power processor can include a plurality of reconfigurable switches, the plurality of reconfigurable switches allowing the sub-arrays to comprise dynamically alterable groupings of individual micro generators.

The switching frequency of the power processor can be from 100 Hz to 1 kHz. This relatively low frequency operation reduces power losses by power converting at a frequency not significantly higher as compared to the generator frequency. In addition, the inductor provided by the power processor can utilize an inductor having an inductance of less than 100 nH, thus making on chip integration practical for the invention. The system can provides a power conversion efficiency of at least 75%, and preferably at least 80%.

An integrated MEMS resonant generator array includes a plurality of piezoelectric micro generators disposed on a substrate, the micro generators each generating a voltage output in response to vibrational energy received. At least one summing node is disposed on said substrate, the summing node being electrically coupled to outputs of the plurality of micro generators. The plurality of micro generators can collectively provide more than one resonant frequency. The said substrate is preferably a single crystal silicon die.

A method of generating electrical energy from vibrational energy includes the steps of providing an integrated MEMS resonant generator system comprising a substrate, a plurality of piezoelectric micro generators disposed on the substrate, the micro generators each generating a voltage output in response to vibrational energy received. At least one power processor is disposed on the substrate, the power processor being electrically coupled to outputs of the plurality of micro generators. The system is subjected to vibrational energy, and provides electrical energy originating at the plurality of voltage outputs.

The method can include the steps of sensing a change in vibrational energy and dynamically adjusting a switching function of the power processor to maximize power delivered to a load or an energy storage device. The method can include the step of dynamically reconfiguring at least one connection between said plurality of micro generators to form dynamically alterable sub-arrays of micro generators.

BRIEF DESCRIPTION OF THE DRAWINGS

A fuller understanding of the present invention and the features and benefits thereof will be accomplished upon review of the following detailed description together with the accompanying drawings, in which:

FIG. 2(a) illustrates a top view of a single resonant micro generator cell including three (3) cantilever structures attached to a single inertial mass, while

FIG. 3(a) illustrates a top view of a single micro generator cell, while

DETAILED DESCRIPTION OF THE INVENTION

The invention provides a system architecture which permits efficient vibrational energy conversion using inductances in the power converters which can be in the sub-microhenry range, thus being several orders of magnitude below those currently used. This aspect of the invention satisfies the stringent size/weight requirements in micro-energy harvesting and permits compatibility with MEMS fabrication processing. The power processor is preferably dynamically modifiable. Thus, when the input conditions change, the change is sensed and the power processor can dynamically adjust its switching functions, such as via the on time, off time, period, or phase to maximize the power delivered to a load or energy storage reservoir.

Figure 1:
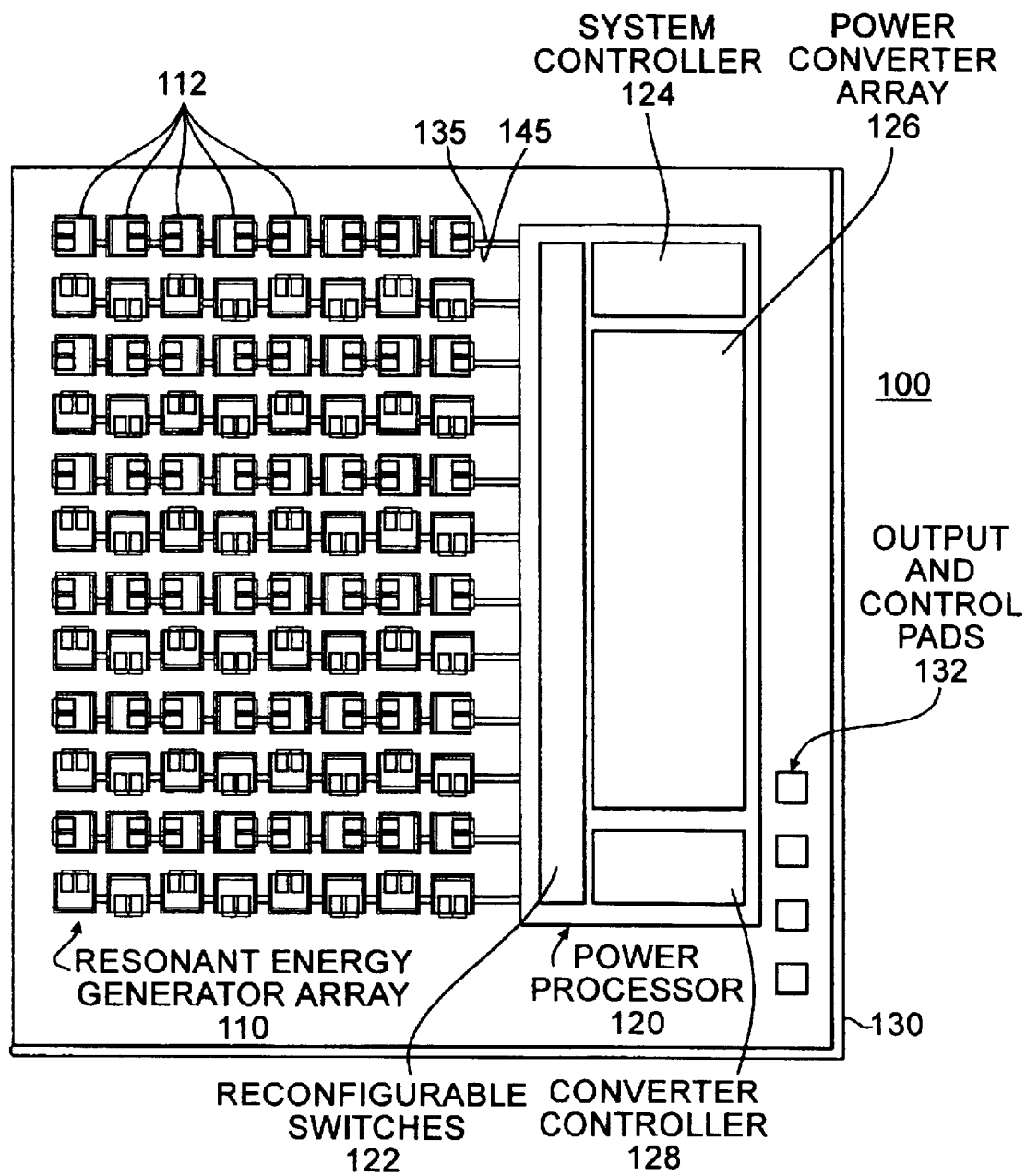
FIG. 1 illustrates the layout of a MEMS chip including a resonant energy micro generator array connected to a power processor, according to an embodiment of the invention.

FIG. 1 illustrates an integrated MEMS resonant generator system 100, according to an embodiment of the invention. System 100 is preferably formed on substrate 130 as a die on a single crystal wafer, such as a silicon wafer. The system 100 includes an micro generator array 110 comprising a plurality of individual micro generator cells 112. The array of micro generators 110 is connected to at least one summing node, such as the power processor 120 shown in FIG. 1. Although only one power processor 120 is shown in FIG. 1, system can include a plurality of power processors 120.

Power processor 120 includes reconfigurable switches 122, system controller 124, power converter array 126 and converter controller 128. System 100 also includes output and control pads 132 on its periphery for connection to other devices. Power processor 120 collects electrical energy generated from the individual micro generators 112 via a plurality of power buses 135 and ground buses 145. Power processor 120 is an intelligent processor which can optimize the power conversion efficiency of system 100 from array 110 by dynamically adjusting its switching functions to maximize power transfer.

By including array 110 which comprises a plurality of smaller micro power generators 112 rather than a single large micro generator, the reliability of system 100 is enhanced because the failure of one or even several micro generators 112 will not significantly affect the total power output provided by system 100.

MEMS systems, such as system 100, are generally fabricated using standard integrated circuit fabrication techniques or similar techniques such as surface micromachining, bulk micromachining and reactive ion etching (RIE). "MEMS" refers to systems that integrate mechanical structures (moving parts) with microelectronics, into a package that is physically very small. MEMS devices are generally custom designed for a given purpose.

Substrate 130 is preferably a single crystal substrate, such as a single crystal silicon. Single crystal silicon provides excellent mechanical properties. In a preferred embodiment, silicon-on-insulator (SOI) substrate starting material is provided. For example, the insulator can be silicon dioxide. Through removal of the silicon dioxide and underlying (thick) silicon substrate region beneath one or more portions of the substrate during processing, a surface single crystal silicon section can be freed to permit movement, such as to form a cantilever structure.

Figure 2A:
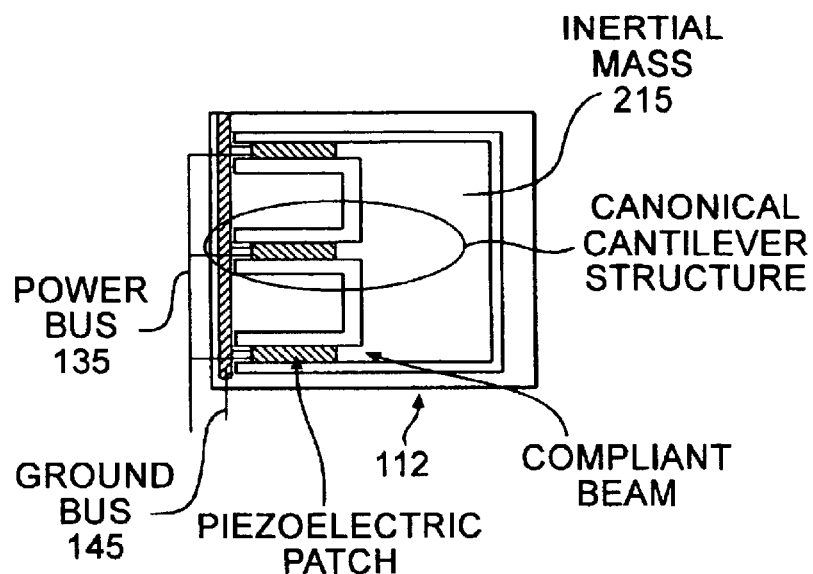
Figure 2B:
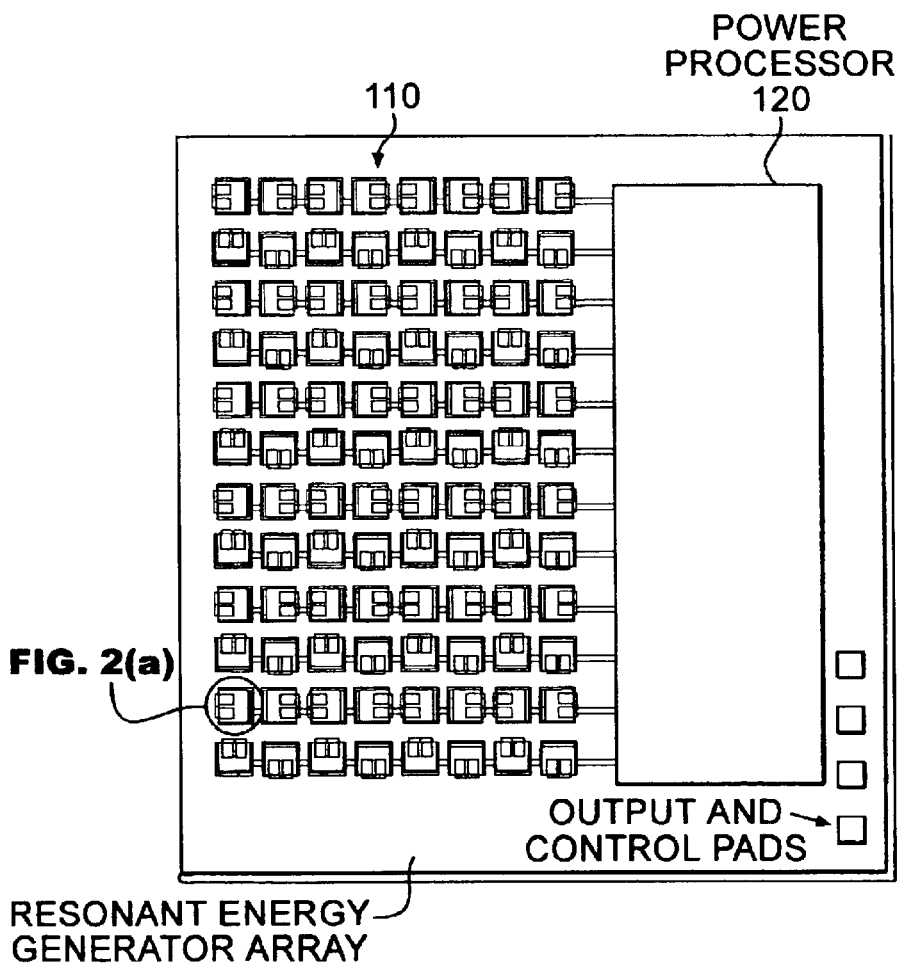
FIG. 2(b) illustrates the relationship of the micro generator cell shown in FIG. 2(a) in relation to an array of micro generators, according to an embodiment of the invention.

Micro generators 112 are preferably each piezoelectric generators, 96 of which are shown in FIG. 1. FIG. 2(a) illustrates a top view of a single piezoelectric resonant micro generator cell 112 including three (3) cantilever structures attached to a single inertial mass, while FIG. 2(b) illustrates the relationship of the micro generator cell 112 shown in FIG. 2(a) in relation to the array of micro generators 110 connected to the power processor 120, according to an embodiment of the invention.

Figure 3A:
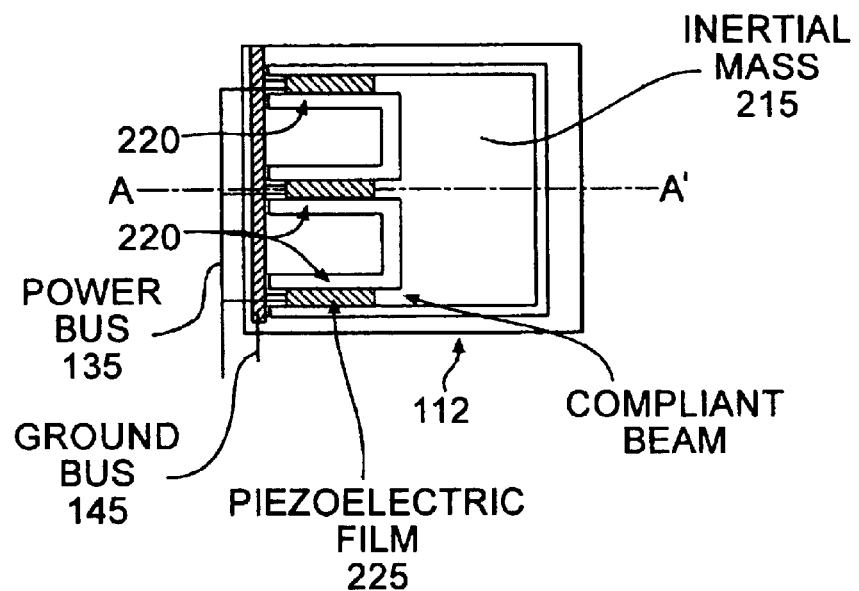
Figure 3B:
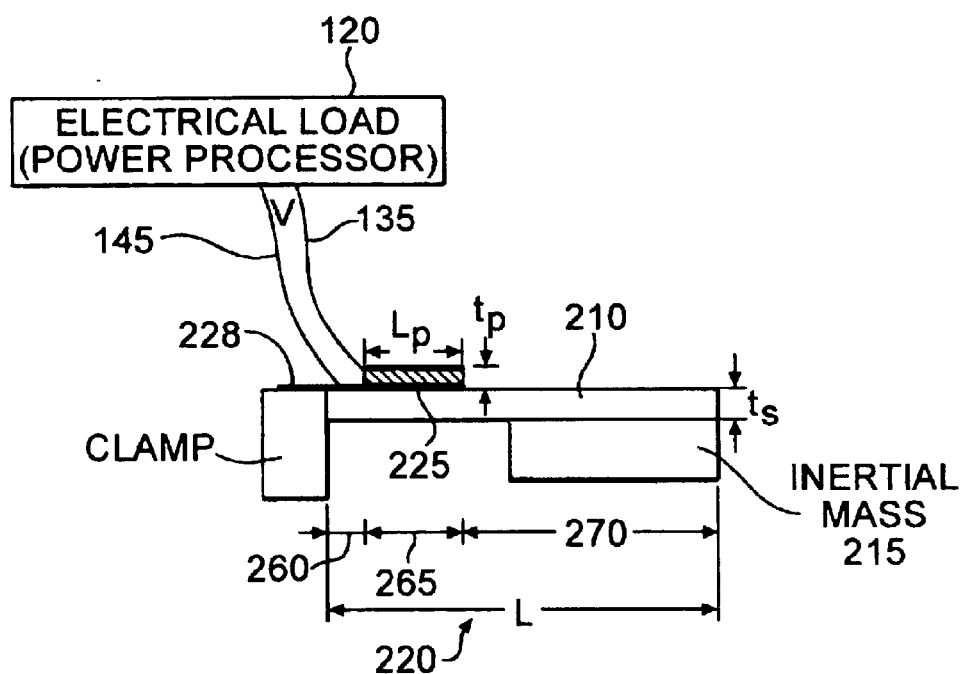
FIG. 3(b) shows a side view of the micro generator cell shown in FIG. 3(a) cut along a line at A–A'.

FIG. 3(a) illustrates a top view of a single micro generator 112, while FIG. 3(b) shows a side view of the micro generator 112 shown in FIG. 3(a) showing a cross-sectional view of the piezoelectric resonant micro generator cell cut along a line the A–A' in FIG. 3(a). Micro generator cell 112 includes three suspended cantilever structures 220 all attached to inertial mass 215 at their tips. Inertial mass 215 is typically the entire thickness of the substrate.

As shown in FIG. 3(b) cantilever structure 220 includes a compliant structural beam 210 having thickness $t_s$, including a piezoelectric film patch 225 (shown cross hatched) bonded to a top portion of beam 210. The length (L) of compliant beam 210 includes three sections, comprising thin silicon 260, piezoelectric film on thin silicon 265, and thick silicon 270 which comprises the inertial mass which is generally the entire wafer thickness. Piezoelectric material 225 is commonly referred to as a patch, the patch having dimensions Lp, $t_p$ and $t_s$. Underlying piezoelectric film patch 225 is one or more electrically conducting layers 228, such as platinum disposed over a titanium adhesion layer.

Although suspended structures 220 are shown in FIGS. 3(a) and (b) and are described as generally being cantilever structure 220, suspended structures 220 are more generally piezoelectric comprising suspended elements formed from any suspended structure that provides flexure under stress. For example, a suspended element can be supported at multiple ends such as two ends, or supported across an entire circumference as in the case of a suspended diaphragm element.

Vibrations received by micro generators 112 cause the cantilever portion of the generators to deflect at their natural frequency provided the excitation includes a frequency component of at least the resonant frequency. If the vibrations received are pulses or pulse-like, the micro generators 112 will be excited at their natural frequency, since a pulse contains effectively all frequency components. However, if the vibrations received are at a frequency below the natural frequency, the micro generator will be excited at the excitation frequency.

The natural or resonant frequency of a piezoelectric cantilever-based micro generator is proportional to the square root of the stiffness; k of the cantilever structure divided by the mass of the cantilever structure including the inertial mass attached to the end of the cantilever (i.e. $(k/m)^{1/2}$. Thus, the resonant frequency of the piezoelectric cantilever-based micro generator can be set by adjusting the inertial mass and/or the cantilever stiffness through a change in cantilever dimensions, such as its length and width through appropriate lithography and etching. The piezoelectric material and piezo dimensions also affect the resonant frequency through its contribution to the mass and stiffness of the overall cantilever structure.

The resulting stress from vibrations received by cantilever structure 220 induces a polarization of the piezoelectric film 225, thus producing a voltage between the top and both of the piezoelectric film 225. The top of piezoelectric film 225 is electrically connected to power bus 135, while the bottom of piezoelectric film 225 is electrically connected to ground bus 145 through electrically conducting layer 228. When subjected to broadband vibrations or an impulse force train, cantilever structure 220 will be excited at its resonant or natural frequency. Thus, buses 135 and 145 transport electrical energy provided by micro generators 112 to a summing node, such power processor 120.

Micro generators 112 within array 110 can be configured to have different resonant frequencies, such as through dimensional differences of micro generators as noted above or through use of different materials for respective micro generators in array 110. This permits the integrated MEMS resonant generator system 100 to utilize a range of different vibration modes and spectra provided by the input power source or power sources.

Although clearly differentiated based on scale, system 100 shown in FIG. 1 is modeled after the robust and redundant power supply provided by conventional macro-scale power generation systems where distributed power generator plants are interconnected through a grid of power lines and substations managed by distribution and control centers. In analogy, respective MEMS micro generators 112 function as individual power plants, interconnects 135 and 145 as the transmission lines, power converter 126 as the substations, and the system controller 124 and converter controller 128 as the control system.

At the macro-scale, conventional electrical power is generated at frequencies and amplitudes to maximize power conversion and delivery efficiency. However, to date, vibrational energy has only been transformed into electrical energy having substantially the same frequency and amplitude as the vibrational energy source. Excitation of micro generators 112 at or near their resonant frequency is known to maximize power extraction by the generator. The power extracted also depends on the resonant frequency of the micro generator, which can be designed to provide desired values through the dimensions of the cantilever and attached inertial mass, as well as the piezoelectric material and its associated dimensions. As noted above, the micro-generator array 110 can consist of a plurality of transducer cells individually designed and collectively configured to resonate at those source frequencies that result in maximal energy transfer.

By solving the governing equation for the cantilever beam in the three sections shown in FIG. 3(b), 260 (silicon beam), 265 (silicon/piezoelectric), and 270 (silicon beam and inertial mass), the static mode shape can be determined using a clamped boundary condition at one end and assuming a perfect silicon/piezoelectric bond. Similar equations can be derived for alternative suspended element configurations. The beam compliance and effective piezoelectric coefficients are then obtained for the reciprocal conditions of applied force and voltage. The compliance and piezoelectric coefficients can be used to develop an equivalent circuit for the micro generator as a function of suspended element (e.g. beam/cantilever) geometry and material parameters.

Figures 4A, 4B:
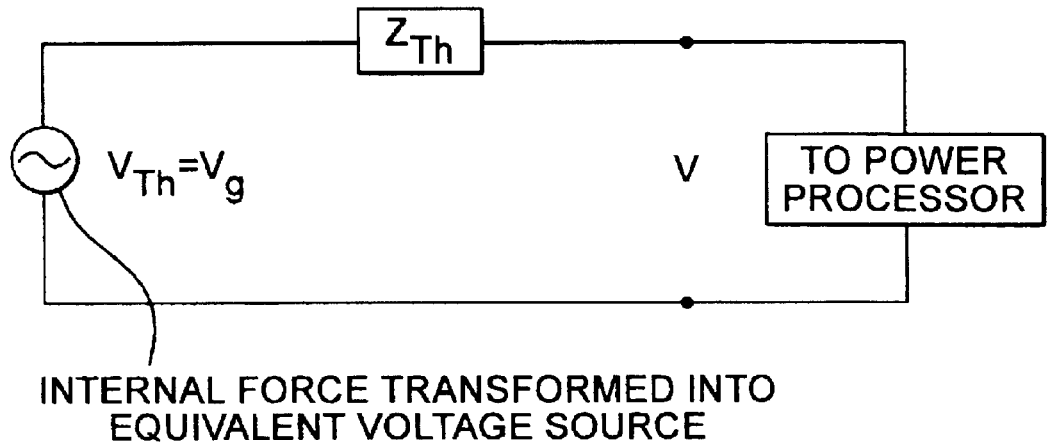
FIG. 4(a) illustrates a Thevenin equivalent circuit representation for a lumped element circuit for a piezoelectric micro generator.
FIG. 4(b) is an equation which relates the Thevenin equivalent voltage source in terms of cantilever lumped circuit element parameters and vibrational energy input parameters.

FIG. 4(a) illustrates a Thevenin equivalent circuit representation for a lumped element circuit of a piezoelectric micro generator. The Thevenin equivalent circuit shown in FIG. 4(a) for a piezoelectric micro generator provides a model for analyzing the scaling of micro generator power output with size and its integration with power electronic circuits and electrical loads. FIG. 4(b) is an equation which relates the Thevenin equivalent voltage source ($V_{Th}$) in terms of cantilever lumped element circuit parameters and vibrational energy input parameters.

Using network theory, the Thevenin equivalent voltage, $V_{Th}$, and impedance, $Z_{Th}$, of a piezoelectric micro generator is represented in terms of input conditions (force amplitude and frequency) and micro-generator material properties and dimensions of the MEMS piezoelectric cantilever. This relation is shown by the equation provided in FIG. 4(b). In this equation, F is the input force amplitude, $\phi$ is the piezoelectric electromechanical transduction factor, $C_o'$ is the electrical blocked capacitance, $R_e$ is the electrical dissipation, $M_{eff}$, $C_{eff}$, and $R_{eff}$ are the effective mass, compliance, and damping, respectively, of the cantilever system, while $\omega$ is the angular frequency of the vibrational source.

Each of these lumped parameters are derived in terms of geometry and material parameters. This yields a useful predictive tool for designing MEMS piezoelectric generators 112 for energy harvesting. A broad range of energy scavenging conditions and piezoelectric materials may be modeled using this micro generator equivalent circuit.

Since each micro generator 112 might not have the right output voltage amplitude or the right output impedance for optimal power transfer, the micro generators 112 in array 110 are generally connected either in series and/or in parallel before they are fed to the power converter 120 as shown in FIG. 1. The connection of micro generators can be fixed or dynamically switchable.

In the fixed embodiment, within the MEMS array of micro generators 110, sub-arrays can be formed by permanent interconnects among groups of micro generators. For example, several micro generators could be connected in series so that the net open-circuit voltage of the sub-array overcomes the parasitic voltage drops in series with the sub-array. The sub-arrays can then be reconfigured at a second level by a reconfigurable switch matrix such that the generator 112 impedance is more commensurate with the power converter impedance.

Figure 5:
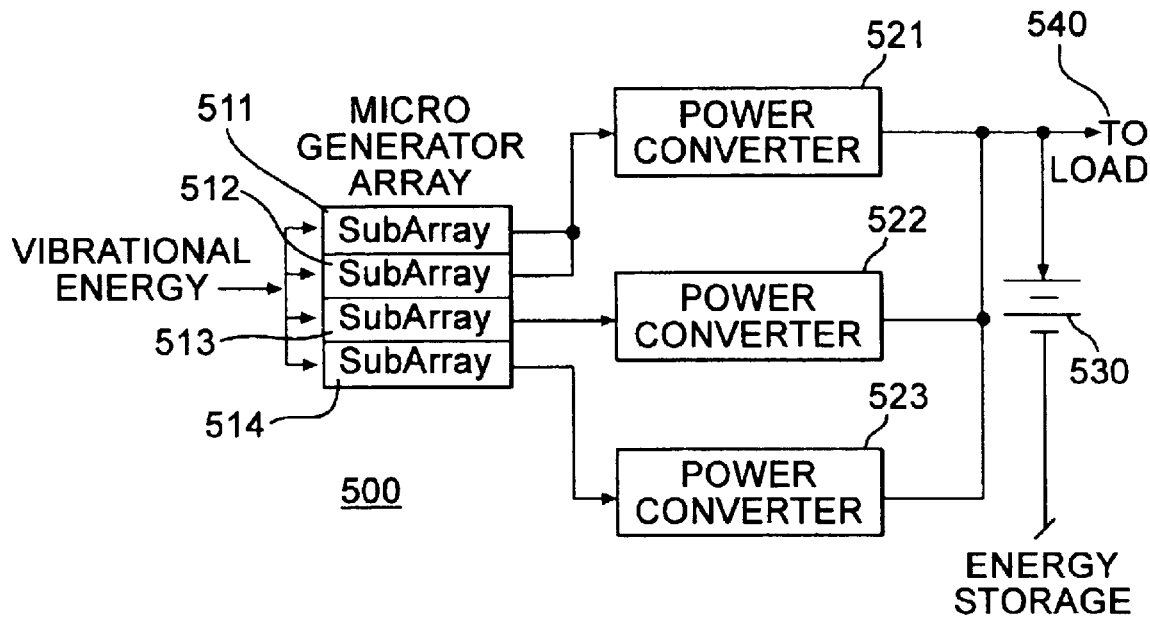
FIG. 5 illustrates an exemplary power processor architecture indicating an arrangement of a plurality of sub arrays of micro generators and a plurality of power converters, according to an embodiment of the invention.

FIG. 5 illustrates a power generation system 500 including four permanently connected sub-arrays of micro generators 511–514 which supply power to three power processors 521–523. The output provided by power converters 521–523 can be stored in energy storage reservoir 530 during certain intervals of time and supplied to load 540 during other intervals of time.

Figure 6:
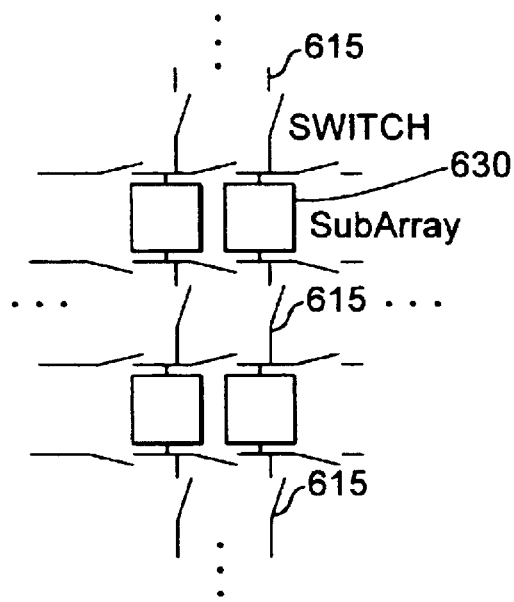
FIG. 6 illustrates an exemplary network of switches which connect a plurality of micro generator sub-arrays and power processors, according to another embodiment of the invention.

FIG. 6 shows an embodiment of the invention 600 including reconfigurable switches 615 attached to each terminal of a two-terminal block that represents a sub-array of micro generators 630 or the input port of a power processor (not shown in FIG. 6). Only three switches 615 are shown per terminal for clarity. The programmable switches 615 allow each terminal to be dynamically connected (or disconnected) with its neighbor terminals. The sub-arrays of micro-generators 630 can be paralleled via these switches so that the output capacitance of the ensemble (the $C_2$ in FIG. 7(a)) is sufficiently large so that the power converter inductance (the $L_2$ in FIG. 7(a)) can be brought down to the nanohenry range to make practical on-chip integration. In particular, given a desired $L_2$ and a desired resonance frequency $f_{resonant}$, such as in the megahertz range, $C_2$ can be made to dynamically satisfy $(2\pi f_{resonant})^2 L_2 C_2 = 1$ to provide the desired $f_{resonant}$ though appropriate interconnection of several micro generator arrays 630 using switches 615.

A scaling analysis performed on a piezo-cantilever structure excited at its resonant frequency and optimally loaded demonstrated that it can provide significantly higher power than power provided by previous self powered microsystems for application to a load. As noted above, the source impedance for piezo-cantilever generators is generally frequency dependent (see the equation shown in FIG. 4(b)).

As noted above, a power converter is needed to ensure maximal power extraction in the presence of multiple harmonics or a non-deterministic spectrum in the energy source. The power converter needs to be small, such using an inductance in the sub-microhenry range to permit practical on-chip integration. In addition, to provide maximal power conversion efficiency, the power converter should be operating at a low switching frequency.

Figure 7A:
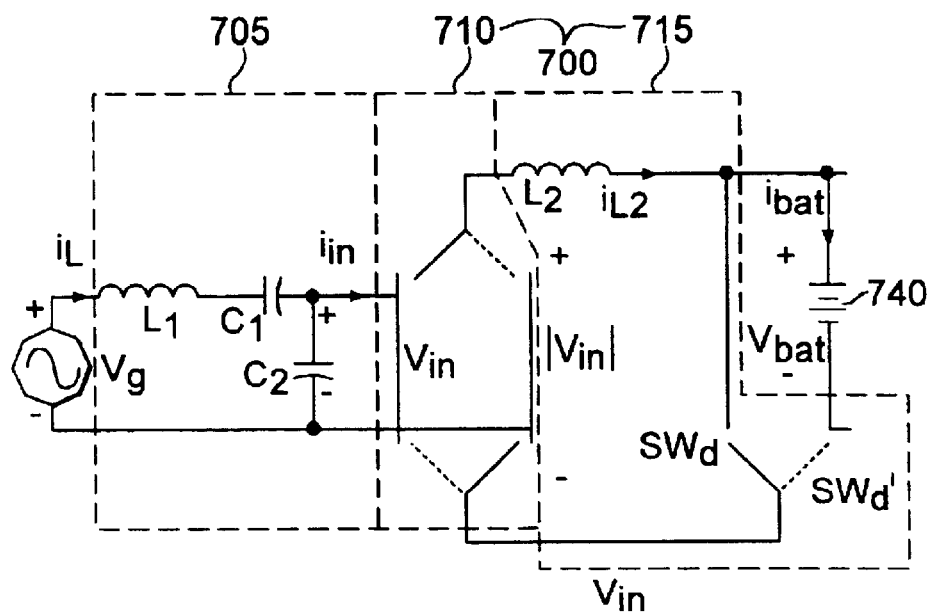
FIG. 7(a) is an equivalent circuit model showing a piezoelectric generator, an exemplary power processor and an energy storage unit.

The equivalent circuit model for an exemplary intelligent power converter circuit 700 for receiving the output from one or preferably a plurality of piezoelectric micro generator sub-arrays is shown in FIG. 7(a). The circuit model for the piezoelectric micro generator sub-array consists of an equivalent voltage source, $v_g$, an inductor, $L_1$, and capacitors, $C_1$ and $C_2$. Formulae are available for computing the model components from device geometry, material characteristics, and interconnect topologies.

Figure 7B:
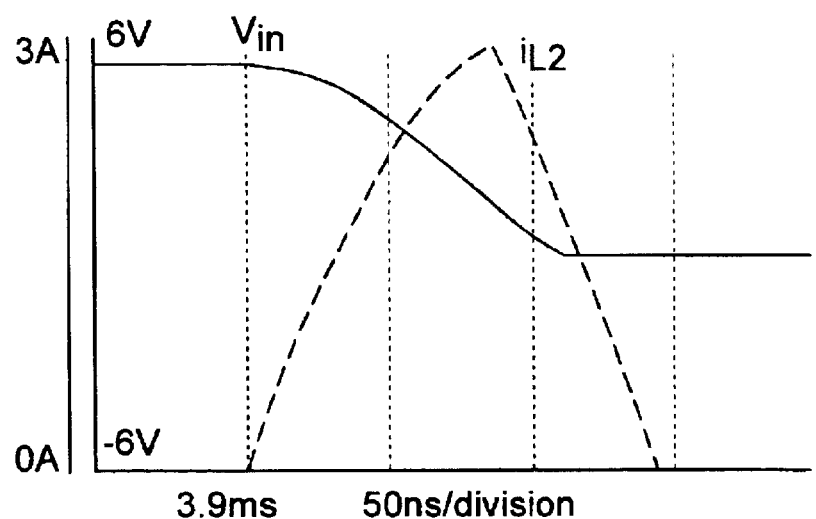
FIGS. 7(b)–(d) are simulation results for various conditions using the equivalent circuit models shown in FIG. 7(a).
Figure 7C:
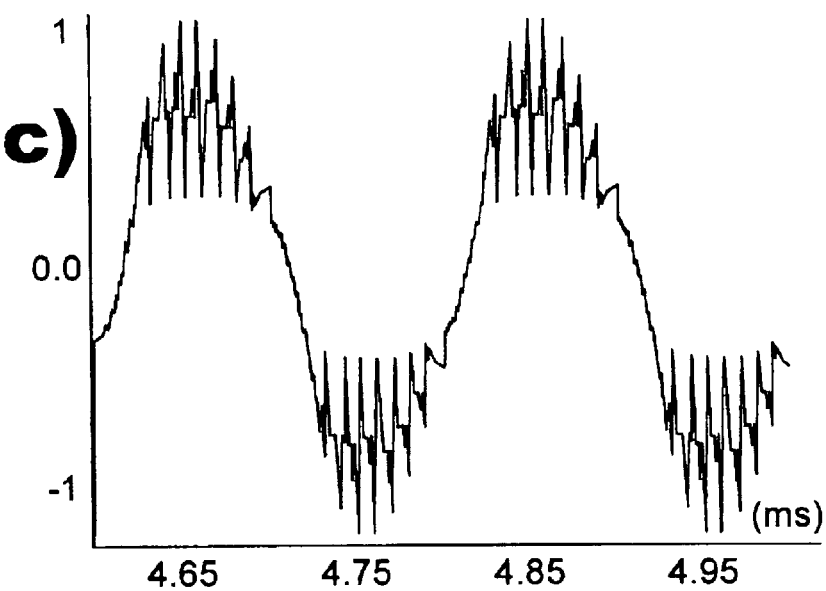
Figure 7D:
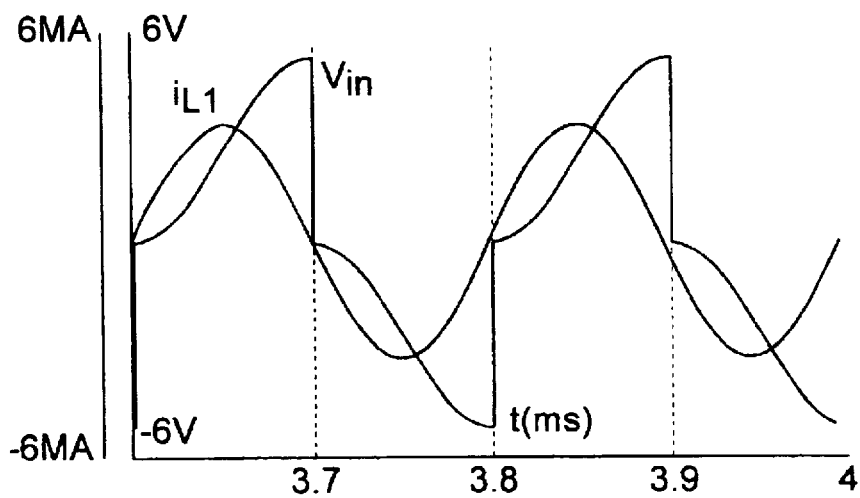
Figure 7E:
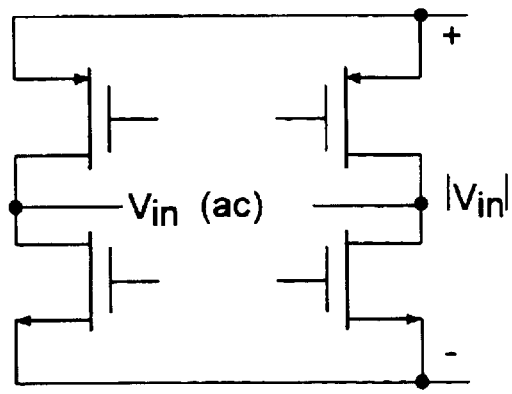
FIG. 7(e) shows an exemplary embodiment of a synchronous rectifier bridge, according to an embodiment of the invention.

Exemplary power converter circuit 700 includes a synchronous rectifier bridge 710 more fully shown in FIG. 7(e). Alternatively, a conventional rectifier bridge could be used. Intelligent power converter circuit 700 also includes a pulse-resonant energy processor (PREP) 715. The (synchronous) rectifier bridge 710 rectifies the alternating polarity signal output by the MEMS piezoelectric generator which is represented by its equivalent circuit model 705. PREP 715 follows the bridge rectifier 710 and extracts bursts (pulses) of energy from rectifier bridge 710, then delivers the energy to an energy reservoir, such as battery 740 shown in FIG. 7(a).

As seen in FIG. 7(c), energy is extracted in the form of resonant pulses with duration on the order of 100 ns, and with repetition rate (or switching frequency) on the order of the generator frequency (on the order of 100 Hertz to 1 kHz). The short resonant period allows the inductor $L_2$ to be small (on the order of 100 nanohenries) to facilitate on-chip integration. The low switching frequency keeps the switching losses low, permitting more energy to be passed to the energy reservoir 740.

The PREP 715 includes two semiconductor switches (SWd and SWd') and one inductor, $L_2$. In order to be integratable on a chip having a practical size, the inductor $L_2$ generally needs to be about 100 nH or less. Prior works suggest that 25 nH can be realized in a 0.5 mm×0.5 mm area. Assuming that $C_2$ is on the order of 10 nF, the resonant frequency generated by the combination of $L_2$ and $C_2$ is above 1 MHz. As the control schemes (discussed below) are able to keep the switching frequency much lower than 1 MHz (e.g. 1 kHz), such as at the generator frequency (e.g. 1 kHz), the energy is transferred in the pulsed-resonant mode. Since the switching loss is directly proportional to the switching frequency, operation at a switching frequency significantly below the resonant frequency set by the combination of $L_2$ and $C_2$ provides low switching losses, which generally permits more efficient energy transfer to a load.

FIG. 7(c) illustrates simulations of the generator voltage and source at a 10 kHz switching frequency. The vibrational source frequency and resonant frequency of the micro generator were set at 5 kHz to facilitate the simulation. The simulation results indicate that a power conversion efficiency of at least approximately 80 % is obtainable. In other words, 80 % of the electrical power output collectively provided by the piezoelectric generator array can be delivered to a load or energy storage device, such as battery 740.

Power conversion efficiency can be further improved through use of lower resistance components, such as a low on resistance MOSFET switch for switches $SW_d$ and $SW_{d'}$. However, a reduction in on resistance normally requires an increase in the size (width) of the MOSFET and thus that of the overall integrated circuit die area.

Figure 8:
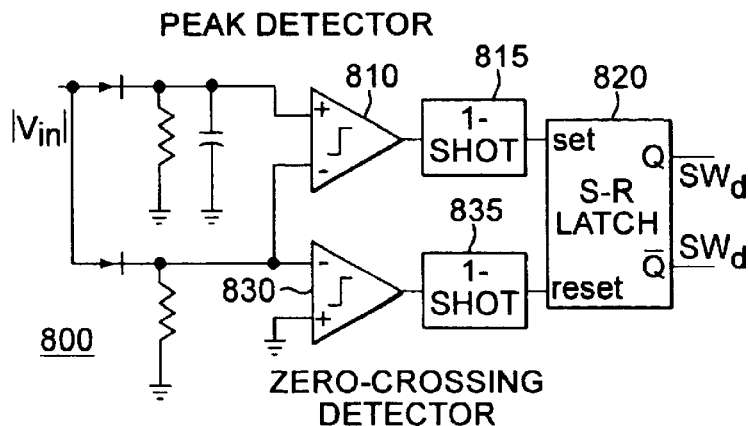
FIG. 8 shows an exemplary embodiment of a controller based on peak generator voltage, according to another embodiment of the invention.

Three exemplary control strategies are now described for PREP, the controlled variable being the amount of energy extracted. An embodiment for the first control strategy is shown by the controller 800 which operates based on peak generator voltage as shown in FIG. 8. A PREP based on controller 800 was used to generate the simulation waveforms shown in FIGS. 7(b)–(d). This control strategy is based on the concept that near-maximum energy is extracted if the extraction is performed expeditiously (e.g., in bursts) since the amount of energy stored on $C_2$ peaks as the voltage on $C_2$ peaks.

As shown in the upper left corner of FIG. 8, a peak detector 810 is used to determine the instant at which the rectified voltage |vin| peaks (see FIG. 7(a)). The output of the peak detector 810 is converted into a narrow (10 nanosecond) pulse by a one-shot (monostable multivibrator) 815. The one-shot 815 then sets an S-R latch 820 to turn on the $SW_d$ switch. As the voltage across $C_2$ approaches zero, the energy stored in this capacitor is all transferred to inductor $L_2$ shown in FIG. 7(a). Thus, the zero-crossing of this voltage is detected by zero crossing detector 830 to reset the S-R latch 820 through one shot 835, such as to turn off SWd and to turn on SWd' if this switch is not a diode. If switch SWd' is a Schottky diode, it automatically turns on after SWd is off, it automatically turns off after its current crosses zero. In addition to being switched at low frequency which provides a low switching loss, SWd is turned on into zero current, and SWd' is turned off from zero current. Zero-current switching is a recognized method to significantly reduce the switching losses.

Figure 9:
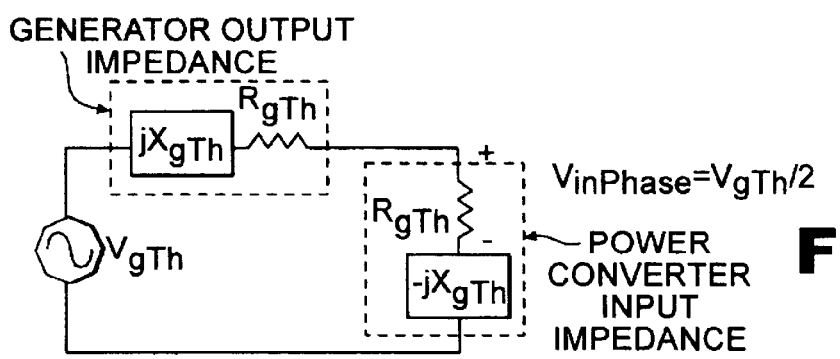
FIG. 9 illustrates the condition for maximum power transfer where the generator output impedance is matched to the power converter input impedance, according to an embodiment of the invention.

A second exemplary control strategy is based on the strategy demonstrated in FIG. 9 based on maximizing power transfer by having input impedance of the converter be the complex conjugate of the output impedance of the generator. As illustrated in FIG. 9, the voltage at the output of the micro generator can be decomposed into an component $v_{inPhase}$ that is in phase with $v_{gTh}$ (the Thevenin equivalent voltage of the generator), via a proportional constant k $$v_{inPhase} = kv_{gTh}$$

and a component $v_{inQ}$ that is orthogonal (quadrature) to $v_{gTH}$:

$$v_{inQ} = v_{in} - v_{inPhase}$$

Since $v_{inQ}$, is orthogonal to $v_{gTH}$, the average of their product over a generator period, $T_{generator}$, is zero:

$$\int_{T_{generator}} v_{gTh} v_{inQ} \, dt = \int_{T_{generator}} v_{gTh}(v_{in} - v_{inPhase}) \, dt = 0$$

Figure 10:
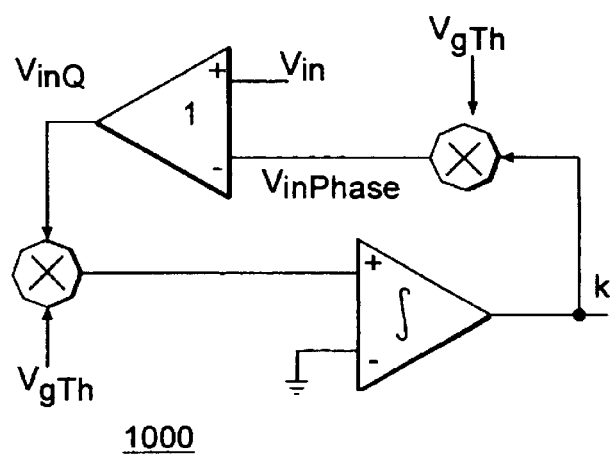
FIG. 10 illustrates an exemplary embodiment of a circuit to determine k from $V_{in}$ and $Vg_{Th}$, according to another embodiment of the invention.

The three preceding equations can be implemented by a circuit, such as circuit 1000 shown in FIG. 10 to extract k from $v_{in}$ and $v_{gTH}$. In particular, the first two equations are realized by upper path. The last equation is realized by the lower path. An open-circuit micro generator cell can be used to generate $v_{gTH}$.

Figure 11:
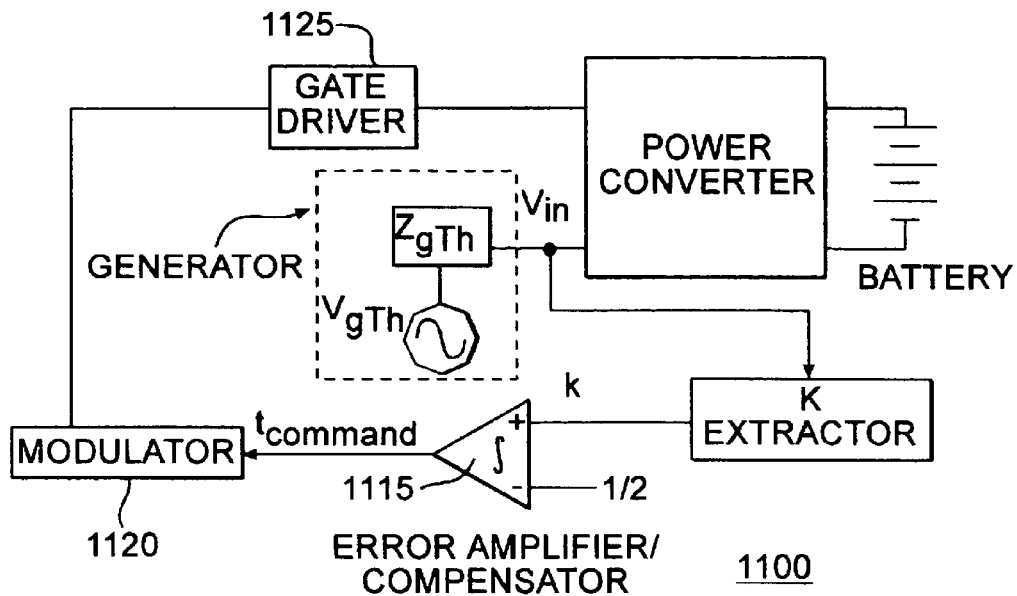
FIG. 11 illustrates an exemplary controller which maximizes power transfer based on impedance matching, according to yet another embodiment of the invention.

With k available, the exemplary controller 1100 shown in FIG. 11 can be used to control the PREP for maximum power transfer. From FIG. 9, the condition for maximal power transfer is, $$v_{inPhase} = v_{gTH}/2 \text{ or } k=1/2$$

As the error amplifier 1115 in FIG. 11 forces k=1/2, it generates a command signal $t_{command}$, which could be the switching period. This signal is converted into the switching function via the Modulator 1120, which could comprise a constant current source charging a capacitor until the capacitor voltage reaches $t_{command}$. The switching function is amplified by the Gate Driver 1125 to turn on $SW_d$ in the PREP. This switch is turned off as the voltage across $C_2$ crosses zero as described for the first control method. The error amplifier 1115 is preferably configured as an integrator having a suitable feedback capacitor to also serve as a compensator to provide loop stability. FIG. 7(d) shows the waveform for $v_{in}$ as the PREP is switched faster than the generator frequency.

Figure 12:
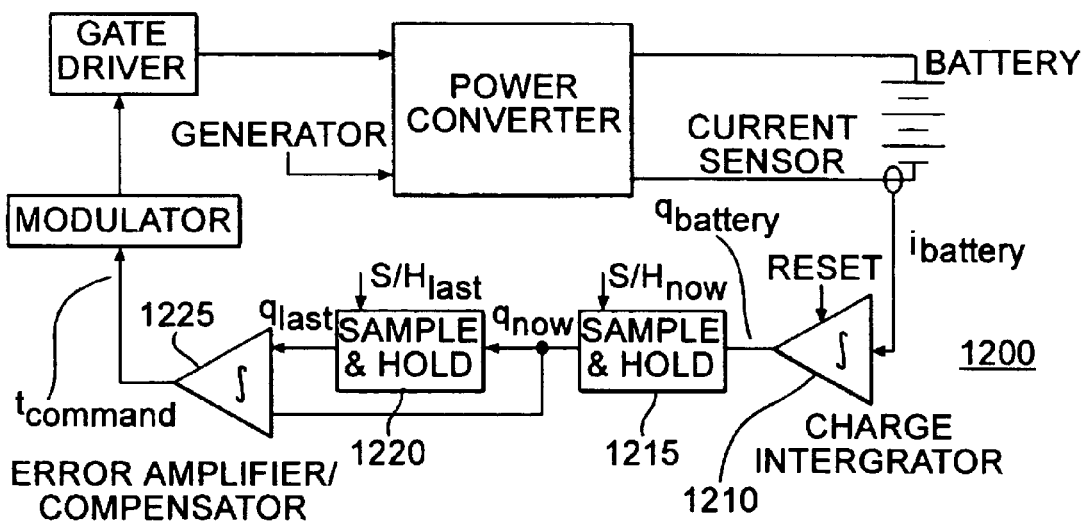
FIG. 12 illustrates an exemplary controller which maximizes power transfer based on delivered charge, according to another embodiment of the invention.

A third exemplary control strategy is described with reference to controller 1200 shown in FIG. 12. This control strategy is based on maximizing the charge $q_{battery}$ into the energy reservoir, by forcing $$\frac{dq_{battery}}{dt} = 0$$

or, in discrete form, $q_{now} - q_{last} = 0$ where $q_{now}$ and $q_{last}$ are the current and previous charges, respectively. A sufficient equivalent condition to the preceding discrete equality is the following:

$$\int_{T_{generator}} (q_{now} - q_{last})dt = 0$$

Figure 13:
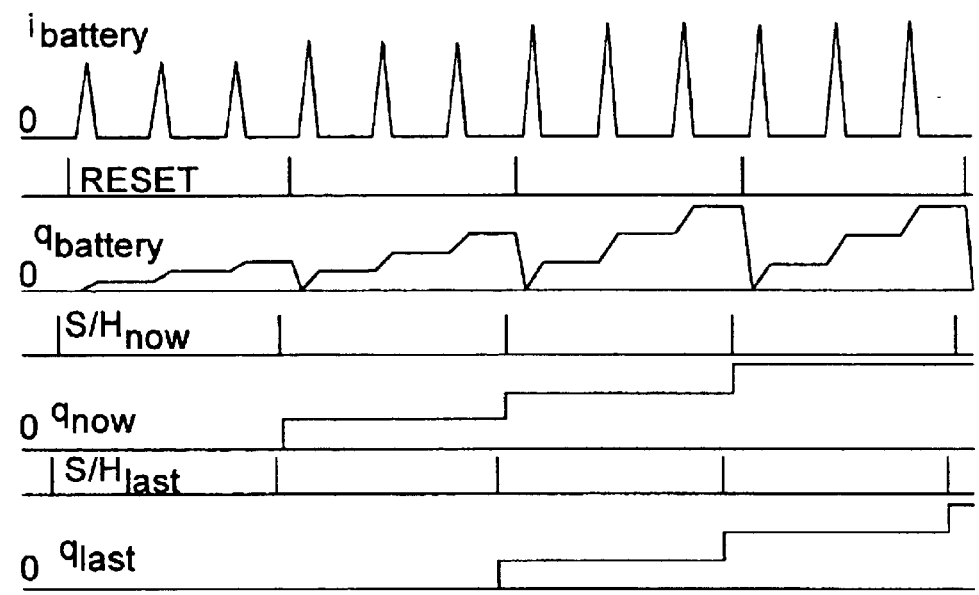
FIG. 13 shows operating waveforms produced by the controller shown in FIG. 12.

The current into the reservoir is integrated by the charge integrator 1210 to find the charge $q_{battery}$. This charge is sampled and held by sample and hold amplifier 1215 to generate $q_{now}$, which is sampled again by sample and hold amplifier 1220 to generate $q_{last}$. The difference between the current charge $q_{now}$ and the previous charge $q_{last}$ can be integrated by error amplifier 1225. Optimal power transfer corresponds to $t_{command}$ that causes $q_{battery}$ to stay constant. In essence, the controller 1200 finds the time derivative of $q_{battery}$ and drives this derivative to force the PREP to operate at peak charge. The waveforms for the variables in FIG. 12 are shown in FIG. 13.

EXAMPLE

Figure 14:
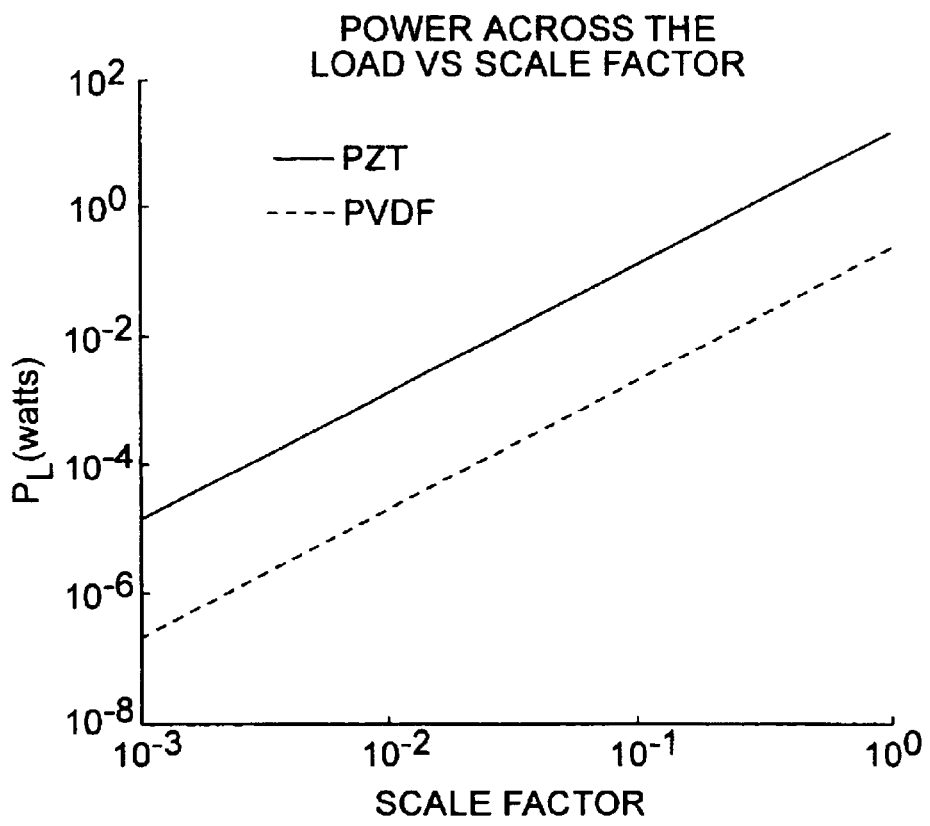
FIG. 14 is a simulation showing the power which can be delivered to a load under the constraint of constant tip deflection/cantilever length.

FIG. 14 shows the calculated power delivered to a load at resonance, where the vibrational source frequency equals the resonant frequency of the generator, as a function of dimension through a scale factor for two different piezoelectric materials. The piezolectric materials are lead-zirconate-titanate (PZT) and polyvinylidene fluoride (PVDF). The power delivered to the load is calculated under the constraint of constant tip deflection/cantilever length for different cantilever lengths where a scale factor of $10^{-3}$ corresponds to a 1 mm cantilever length, 1 $\mu$N input force, and 1 kHz resonant frequency.

Using the standard normal-mode concept, the vibration response of a system will be a linear combination of the normal modes of the system. For an impulse train, similar to that encountered in a periodic heel-strike application, the response will be dominated by the fundamental resonance mode.

As seen from FIG. 14, a single MEMS PZT piezoelectric micro-generator of 1 mm cantilever length (corresponding to a scale factor of $10^{-3}$) delivers approximately 10 $\mu$W when excited at resonance with a 1 $\mu$N point force. An array of 60 micro generators can be fabricated on a 1 cm×1 cm MEMS chip assuming a cell size of $(1.1\times10^{-3} \text{ cm})^2$ including a 10% allowance for chip separation and 75% utilization of the chip area. Using an assumed power converter efficiency of 70%, the estimated total power output by the resonant generator is 420 $\mu$W for the REMAP 60 element micro generator array.

Since 1 $\mu$N point force corresponds to a 0.2 g acceleration for the cantilever inertial mass, a 1 g acceleration is expected to net $5^2=25$ times greater power or approximately 10 mW due to the quadratic dependence of the output power on force as the voltage generated is proportional to input force amplitude (See FIG. 4(*b*)). This range of acceleration is commonly encountered under a variety of vibrational environments including rotating machinery, vehicles, and ambulatory motion.

The predicted 10 mW power output at 1 g acceleration produced by the 60 micro generator array can enable wireless self-powered sensors in diverse vibration-rich environments. Applications can include surveillance, such as autonomous wireless sensors, self-powered sensors for conditional maintenance of equipment, and self-powered cellular sensor networks. For example, dormant sensors that initiate operation in the presence of vibrations by scavenging energy from the offending vibrations and non-intrusive energy scavenging may be an important potential application of REMAP.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

We claim:

1. An integrated MEMS resonant generator-based system, comprising:
   a substrate;
   a plurality of piezoelectric micro generators disposed on said substrate, said micro generators comprising at least one suspended structure including a piezoelectric layer, said suspended structure attached to an inertial mass, each of said plurality of micro generators generating a voltage output across said piezoelectric layer through deflection of said suspended structure in response to vibrational energy received, and
   at least one power processor disposed on said substrate, said power processor electrically coupled to outputs of said plurality of micro generators.

2. The system of claim 1, wherein said plurality of micro generators collectively provide more than one resonant frequency.

3. The system of claim 1, wherein said said power processor has an imput and an output, said imput of said power processor electrically coupled to outputs of said plurality of micro generators, said power processor comprising:
   a sensor for measuring at least one electrical parameter provided at said outputs of said plurality of micro generators;
   at least one switch electrically connected to outputs of said plurality of micro generators, and
   a controller for controlling dynamic switching of said switch based on said electrical parameter, said switching increasing power provided at said output of said power processor.

4. The system of claim 3, wherein said power processor further comprises a rectifier coupled to said outputs of said plurality of micro generators for generating a rectified voltage wherein said sensor comprises a peak detector, said dynamic switching of said power processor being based on said peak detector determining instants when said rectified voltage is at a peak value.

5. The system of claim 3, wherein said controller dynamically adjusts an input impedance of said power processor, said input impedance dynamically matching output impedances of said plurality of micro generators.

6. The system of claim 5, wherein said system provides a power conversion efficiency of at least 75%.

7. The system of claim 3, wherein said controller dynamically maximizes charge transferred into a load or an energy reservoir.

8. The system of claim 1, wherein said substrate comprises single crystal silicon, said inertial mass utilizing an entire thickness of said substrate.

9. The system of claim 1, wherein said plurality of micro generators are interconnected to form a plurality of subarrays comprising groups from said plurality of micro generators.

10. The system of claim 9, wherein said power processor includes a plurality of reconfigurable switches, said plurality of reconfigurable switches dynamically alterable groupings of said plurality of micro generators to form reconfigurable ones of said sub-arrays.

11. The system of claim 1, wherein a switching frequency of said power processor is from 100 Hz to 1 kHz.

12. The system of claim 1, wherein said power processor provides an inductor, wherein an inductance of said inductor is less than 100 nH.

13. A method of generating electrical energy from vibrational energy, comprising the steps of:

providing an integrated MEMS resonant generator system comprising a substrate, a plurality of piezoelectric micro generators disposed on said substrate, said micro generators comprising at least one suspended structure including a piezoelectric layer, said suspended structure attached to an inertial mass each of said plurality of micro generators generating a voltage output across said piezoelectric layer through deflection of said suspended structure in response to vibrational energy received, and at least one power processor disposed on said substrate, said power processor electrically coupled to outputs of said plurality of micro generators;

subjecting said system to external vibrational energy, and providing electrical energy from summing said plurality of voltage outputs.

14. The method of claim 13, wherein said plurality of micro generators collectively provide more than one resonant frequency.

15. The method of claim 13, further comprising the steps of sensing a change in said vibrational energy and dynamically adjusting a switching function of said power processor to maximize power delivered to a load or an energy storage device.

16. The method of claim 13, wherein said substrate is single crystal silicon die.

17. The method of claim 13, further comprising the step of dynamically reconfiguring at least one connection between said plurality of micro generators.

18. The method claim 13, wherein said system includes a power processor, and at least one switch electrically connected to outputs of said plurality of micro generators, further comprising the steps of rectifying said electrical energy summed from said plurality of voltage outputs to generate a rectified voltage, peak detecting said rectified voltage, and dynamically switching said power processor being based on instants when said rectified voltage is at a peak value.

19. The method claim 13, wherein said system includes a power processor and at least one switch electrically connected to outputs of said plurality of micro generators, further comprising the step of dynamically adjusting an input impedance of said power processor, said input impedance dynamically matching output impedances of said plurality of micro generators.

* * * * *